(12) United States Patent
Hsu et al.

(10) Patent No.: US 10,788,514 B2
(45) Date of Patent: Sep. 29, 2020

(54) SEMICONDUCTOR TEST APPARATUS

(71) Applicant: Hermes-Epitek Corp., Taipei (TW)

(72) Inventors: Wen-Yuan Hsu, Hsinchu (TW); Shih-Ying Chou, Hsinchu (TW)

(73) Assignee: HERMES-EPITEK CORP., Taipei (TW)

( * ) Notice: Subject to any disclaimer, the term of this patent is extended or adjusted under 35 U.S.C. 154(b) by 0 days.

(21) Appl. No.: 15/971,235

(22) Filed: May 4, 2018

(65) Prior Publication Data

US 2018/0335450 A1  Nov. 22, 2018

(30) Foreign Application Priority Data

May 18, 2017  (TW) .............................. 106116450 A

(51) Int. Cl.
*G01R 1/44* (2006.01)
*G01R 31/26* (2020.01)
*G01R 31/28* (2006.01)
*G01R 1/04* (2006.01)

(52) U.S. Cl.
CPC ........... *G01R 1/44* (2013.01); *G01R 31/2601* (2013.01); *G01R 31/2865* (2013.01); *G01R 31/2874* (2013.01); *G01R 1/04* (2013.01); *G01R 31/2875* (2013.01); *G01R 31/2877* (2013.01)

(58) Field of Classification Search
CPC ........................................................ G01R 1/44
See application file for complete search history.

(56) References Cited

U.S. PATENT DOCUMENTS

| | | | | |
|---|---|---|---|---|
| 4,848,090 A | * | 7/1989 | Peters | ..................... F25B 21/02 62/3.3 |
| 5,006,796 A | * | 4/1991 | Burton | ..................... F25B 21/04 165/61 |
| 6,032,724 A | * | 3/2000 | Hatta | ................. H01L 21/67103 165/80.2 |
| 6,043,671 A | * | 3/2000 | Mizuta | ................ G01R 31/2886 324/750.08 |
| 8,272,780 B1 | * | 9/2012 | Wilkins | ............. G01R 31/2817 324/750.03 |
| 2014/0103947 A1 | * | 4/2014 | Phan | .................... G01R 31/003 324/750.05 |

* cited by examiner

*Primary Examiner* — Jas A Sanghera
(74) *Attorney, Agent, or Firm* — Muncy, Geissler, Olds & Lowe, P.C.

(57) ABSTRACT

A semiconductor test apparatus includes a test chamber, a chuck and a refrigeration element. The chuck is arranged in the test chamber to fix a semiconductor element to be tested. The refrigeration element is connected to the test chamber to reduce a chamber ambient temperature of the test chamber from a first temperature to a second temperature. The foregoing semiconductor test apparatus is able to reduce the chamber ambient temperature of the test chamber to be equal to or lower than the specified test temperature.

9 Claims, 4 Drawing Sheets

Prior art

SEMICONDUCTOR TEST APPARATUS

BACKGROUND OF THE INVENTION

1. Field of the Invention

The present invention relates to a test apparatus, particularly to a semiconductor test apparatus for testing wafers or chips.

2. Description of the Prior Art

After fabrication, semiconductor elements, such as a wafer, will be tested in an ambient, higher, or lower temperature to find out the malfunction modes in the ambient, higher, or lower temperature. Refer to FIG. 1. The conventional semiconductor test apparatus comprises a test chamber 11, a chuck 12 arranged inside the test chamber 11, and a probe card 13. The tested semiconductor element 80 is placed on the chuck 12 and tested by the probe card 13 at a specified test temperature. A test module 14a is electrically connected with the probe card 13, processing the signals detected by the probe card 13. The test module 14a is also electrically connected with a host computer 14b. The test personnel use the host computer 14b to operate the semiconductor test apparatus.

In order to support the tests undertaken at different temperatures, the chuck 12 of the conventional semiconductor test apparatus has four different specifications: the normal-temperature chuck, the high-temperature chuck (the operating temperature thereof ranges from the ambient temperature to 150° C.), the air-cooled high-temperature chuck (the operating temperature thereof ranges from 25° C. to 150° C.), and the refrigerated high and low temperature chuck (the operating temperature thereof ranges from −55° C. to 150° C.). The high-temperature chuck is frequently used in semiconductor tests at present. However, the chuck 12 is likely to be affected by the ambient temperature in normal-temperature tests. For example, if the ambient temperature of the test chamber 11 is 28° C., the temperature of the chuck 12 would not be lower than 28° C. In other words, the chuck 12 may be unable to reach a specified test temperature, such 25° C. In such a case, the test must adopt the air-cooled high-temperature chuck or the refrigerated high and low temperature chuck.

Refer to FIG. 1 again. For the conventional air-cooled high-temperature chuck or the refrigerated high and low temperature chuck, a refrigeration pipeline 15 is arranged inside the chuck 12. A refrigerant gas or liquid is fed into the refrigerating pipeline 15 from the inlet 151. Heat exchange undertakes between the refrigerant gas/liquid and the chuck 12 to lower the temperature of the chuck 12. The heated refrigerant gas/liquid is output from the outlet 152 and chilled down. The chilled refrigerant gas/liquid is fed into the refrigerating pipeline 15 again. The built-in refrigeration pipeline 15 and the refrigerator increase the organizational complexity and make the price of the conventional air-cooled high-temperature chuck or the refrigerated high and low temperature chuck much higher than the conventional high-temperature chuck. Besides, the refrigerated high and low temperature chuck needs consumable refrigerant, which further increases the cost of semiconductor test.

Accordingly, simplifying the refrigeration system of semiconductor test apparatuses has become the target the manufacturers are eager to achieve.

SUMMARY OF THE INVENTION

The present invention provides a semiconductor test apparatus, wherein a refrigeration element is connected with the test chamber for reducing the chamber ambient temperature of the test chamber, whereby, in case of a higher room temperature, the present invention enables the chuck inside the test chamber and the tested semiconductor element to reach a specified test temperature that is slightly lower than the room temperature.

In one embodiment, the semiconductor test apparatus of the present invention comprises a test chamber, a chuck, and a refrigeration element. The chuck is arranged inside the test chamber and used to fix a tested semiconductor element. The refrigeration element is connected with the test chamber and used to reduce the chamber ambient temperature of the test chamber from a first temperature to a second temperature.

Below, embodiments are descried in detail in cooperation with the attached drawings to make easily understood the objectives, technical contents, characteristics and accomplishments of the present invention.

DESCRIPTION OF THE PREFERRED EMBODIMENTS

Figure 1:
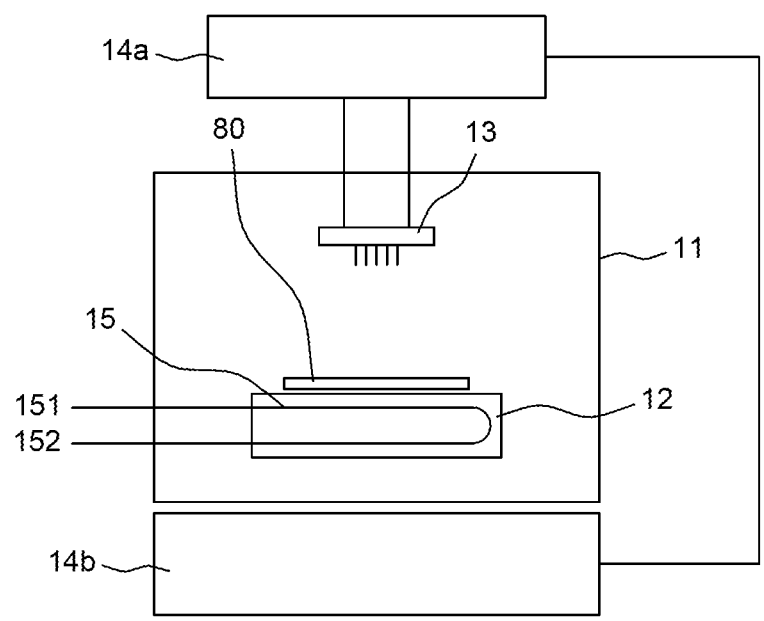
FIG. 1 is a diagram schematically showing a conventional semiconductor test apparatus.

The present invention will be described in detail with embodiments and attached drawings below. However, these embodiments are only to exemplify the present invention but not to limit the scope of the present invention. In addition to the embodiments described in the specification, the present invention also applies to other embodiments. Further, any modification, variation, or substitution, which can be easily made by the persons skilled in that art according to the embodiment of the present invention, is to be also included within the scope of the present invention, which is based on the claims stated below. Although many special details are provided herein to make the readers more fully understand the present invention, the present invention can still be practiced under a condition that these special details are partially or completely omitted. Besides, the elements or steps, which are well known by the persons skilled in the art, are not described herein lest the present invention be limited unnecessarily. Similar or identical elements are denoted with similar or identical symbols in the drawings. It should be noted: the drawings are only to depict the present invention schematically but not to show the real dimensions or quantities of the present invention. Besides, matterless details are not necessarily depicted in the drawings to achieve conciseness of the drawings.

Figure 2:
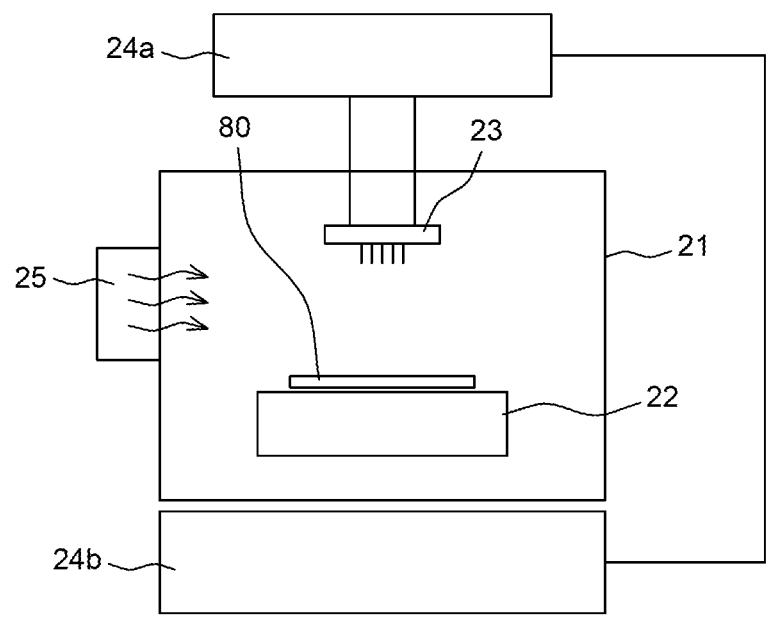
FIG. 2 is a diagram schematically showing a semiconductor test apparatus according to a first embodiment of the present invention.

Refer to FIG. 2. In one embodiment, the semiconductor test apparatus of the present invention comprises a test chamber 21, a chuck 22, and a refrigeration element 25. The test chamber 21 defines a test space and separate the test space from the external environment. It should be noted: the test chamber 21 is not airtight completely. Therefore, the temperature of the external environment may influence the internal temperature of the test chamber 21. For simplicity, the temperature of the external environment is called the external environment temperature, and the internal temperature of the test chamber 21 is called the chamber ambient temperature. The chuck 22 is arranged inside the test chamber 21. A tested semiconductor element 80, such as a wafer or a chip, is fixed on the chuck 21 for test.

The refrigeration element 25 is connected with the test chamber 2l and chills the air inside the test chamber 21 to lower the chamber ambient temperature of the test chamber 21. For example, the refrigeration element 25 reduces the chamber ambient temperature of the test chamber 21 to a specified test temperature. Once heat balance is achieved between the chuck 22 inside the test chamber 21 and the tested semiconductor element 80 placed on the chuck 22, a probe card 23 is used to contact the semiconductor element 80 and measure required signals. A test module 24a and a host computer 24b process the measured signals and determine whether the semiconductor element 80 malfunctions. The probe card 23, the test module 24a, the host computer 24b, and the wafer transfer module (not shown in the drawings) can be realized by the persons having ordinary knowledge in the field with the existing technologies. Therefore, they are not the characteristic technologies of the present invention and will not be further described herein.

It should be noted: it is via chilling the air inside test chamber 21 that the refrigeration element 25 lowers the chamber ambient temperature of the test chamber 21 and reduces the temperature of the chuck 22. Therefore, no refrigeration pipeline needs to be installed inside the chuck 22, in comparison with the conventional technology shown in FIG. 1. In other words, the refrigeration system of the present invention is simpler than that of the conventional technology. One objective of the present invention is to slightly reduce the chamber ambient temperature of the test chamber 21 to the test temperature. Therefore, the refrigeration element 25 only needs a refrigeration capacity sufficient to reduce the chamber ambient temperature in a small range.

Suppose that the external environment temperature of the test chamber 21 is 22° C. Although the chamber ambient temperature of the test chamber 21 is influenced by the external environment temperature, the chamber ambient temperature of the test chamber 21, such as the temperature ranging from 26 to 27° C., will be higher than the external environment temperature during test. If the test apparatus is not equipped with a refrigeration system, the chuck 22 inside the test chamber 21 will be unable to reach the specified test temperature, such as 25° C. In such a case, it is sufficient for the refrigeration element 25 of the semiconductor test apparatus of the present invention to have a refrigeration capacity able to lower the chamber ambient temperature of the test chamber 21 from 26-27° C. to the specified test temperature 25° C. In one embodiment, the refrigeration element 25 has a refrigeration capacity able to lower the chamber ambient temperature of the test chamber 21 from a first temperature to a second temperature, wherein the first temperature is the chamber ambient temperature of the test chamber of the semiconductor test apparatus free of the refrigeration system during test, and wherein the second temperature is a temperature lower than or equal to a specified test temperature, and wherein the difference between the first temperature and the second temperature is equal to or smaller than 10° C. It is easily understood: appropriate design of the test chamber 21 can modify the temperature difference between the external environment temperature and the chamber ambient temperature of the test chamber 21. In one embodiment, the present invention can apply to a situation where the difference between the first temperature and the external environment temperature is equal to or smaller than 10° C.

Figure 3:
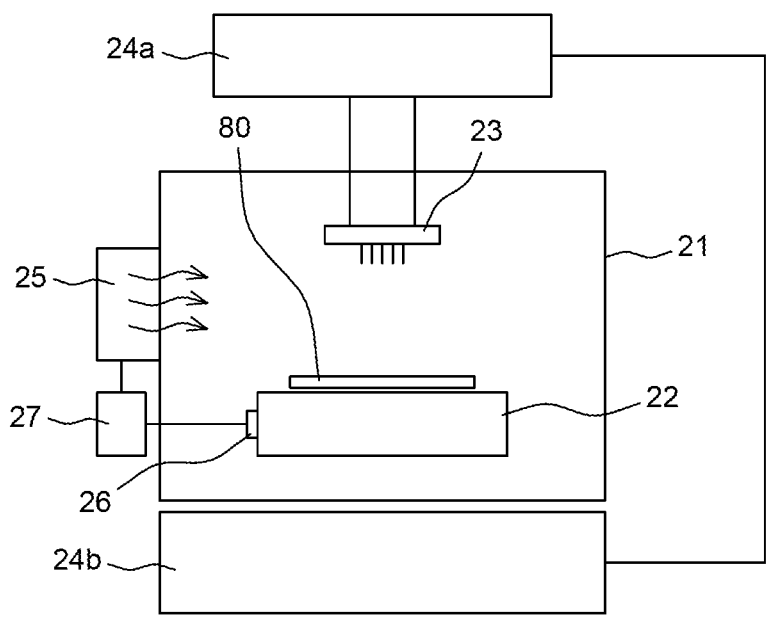
FIG. 3 is a diagram schematically showing a semiconductor test apparatus according to a second embodiment of the present invention.

Refer to FIG. 3. In one embodiment, the semiconductor test apparatus of the present invention further comprises a temperature sensor 26 and a controller 27. The temperature sensor 26 is used to measure the operating temperature of the chuck 22. The controller 27 is electrically connected with the refrigeration element 25 and the temperature sensor 26. The controller 27 determines whether to turn on the refrigeration element 25 according to the operating temperature measure by the temperature sensor 26. For example, the refrigeration element 25 is turned on while the operating temperature of the chuck 22 is higher than the specified test temperature; the refrigeration element 25 is turned off while the operating temperature of the chuck 22 is equal to or lower than the specified test temperature.

Figure 4:
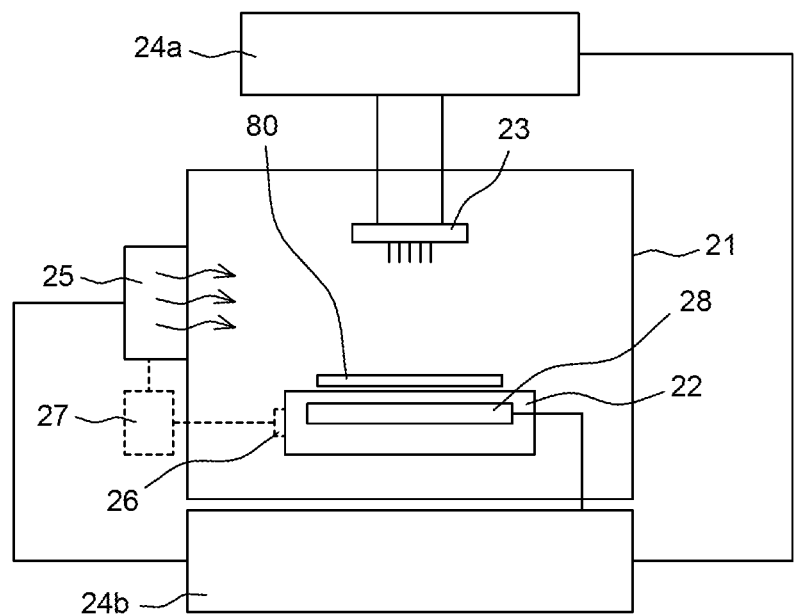
FIG. 4 is a diagram schematically showing a semiconductor test apparatus according to a third embodiment of the present invention.

Refer to FIG. 4. In one embodiment, the semiconductor test apparatus of the present invention further comprises a heating element 28. The heating element 28 is connected with the chuck 22 and able to heat the chuck 22. In this embodiment, the semiconductor test apparatus of the present invention can undertake tests in a higher test temperature. It is easily understood: the cooperation of the refrigeration element 25 and the heating element 28 can precisely control the operating temperature of the chuck 22 within an appropriate range of temperature. The existing high-temperature semiconductor apparatus has appropriate temperature-control design that includes the sensors for measuring the operating temperature of the chuck 22. In one embodiment, the temperature sensor 26 and the controller 27, which are drawn with dashed lines, are integrated with the host computer 24b of the existing high-temperature semiconductor test apparatus; whether the refrigeration element 25 is turned on by the determination of the host computer 24b.

Figure 5:
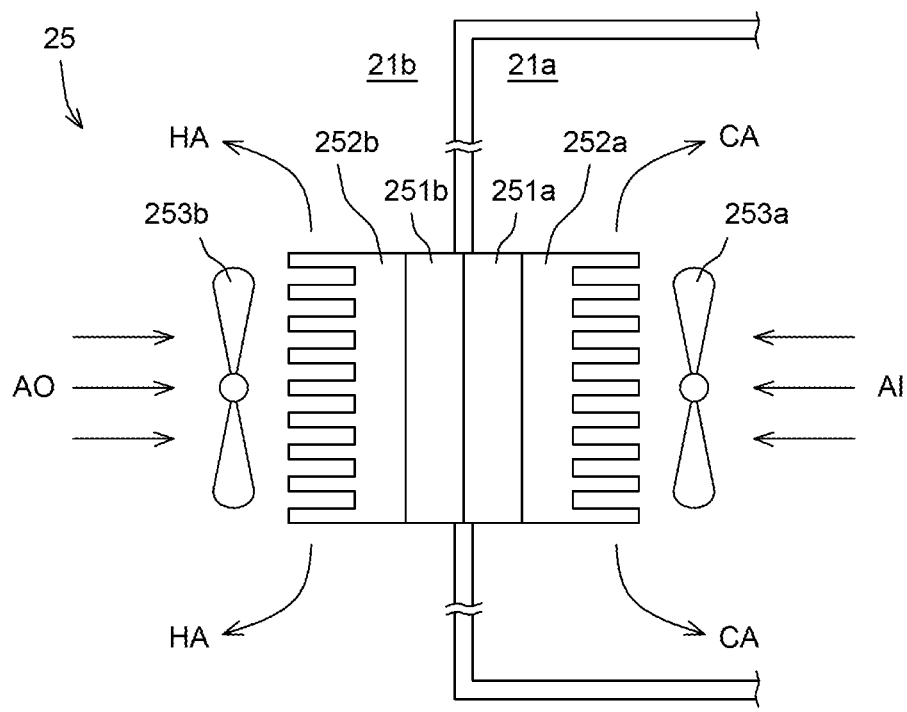
FIG. 5 is a diagram schematically showing a refrigeration element of a semiconductor test apparatus according to one embodiment of the present invention.

In one embodiment, the refrigerating temperature of a refrigerating end of the refrigeration element 25 is lower than the external environment temperature outside the test chamber 21; the difference between the refrigerating temperature and the external environment temperature is less than or equal to 6° C. Refer to FIG. 5. In one embodiment, the refrigeration element 25 is a semiconductor refrigeration element (or called the refrigeration chip); a cold end 251a of the semiconductor refrigeration element is arranged in an inner side 21a of the test chamber 21, chilling the air inside the test chamber 21; a hot end 251b of the semiconductor refrigeration element is arranged in an outer side 21b of the test chamber 21, exhausting heat out of the test chamber 21. In one embodiment, the refrigeration element 25 further includes a first heat conduction element 252a; the first heat conduction element 252a is connected with the cold end 251a of the semiconductor refrigeration element to increase the area of heat exchange and enhance the efficiency of heat conduction in the cold end 251a of the semiconductor refrigeration element. In one embodiment, the refrigeration element 25 further includes a first electric fan 253a; the electric fan 253a guides the air in the inner side 21a of the test chamber 21 to flow through the first heat conduction element 252a. For example, the air AI inside the test chamber 21 is driven by the first electric fan 253a to the first heat conduction element 252a for heat exchange; the cooled air CA is then driven back to the test chamber 21.

In one embodiment, the refrigeration element 25 further includes a second heat conduction element 252b; the second heat conduction element 252b is connected with the hot end 251b to increase the area of heat exchange and enhance the efficiency of heat conduction in the hot end 251b of the semiconductor refrigeration element. In one embodiment, the refrigeration element 25 further includes a second electric fan 253b; the second electric fan 253b guides the air in the outer side 21b of the test chamber 21 to flow through the second heat conduction element 252b. For example, the air AO outside the test chamber 21 is driven by the second electric fan 253b to the second heat conduction element 252b for heat exchange; the heated air HA is then driven away from the test chamber 21, whereby to assist the hot end 251b of the semiconductor refrigeration element in heat dissipation.

Figure 6:
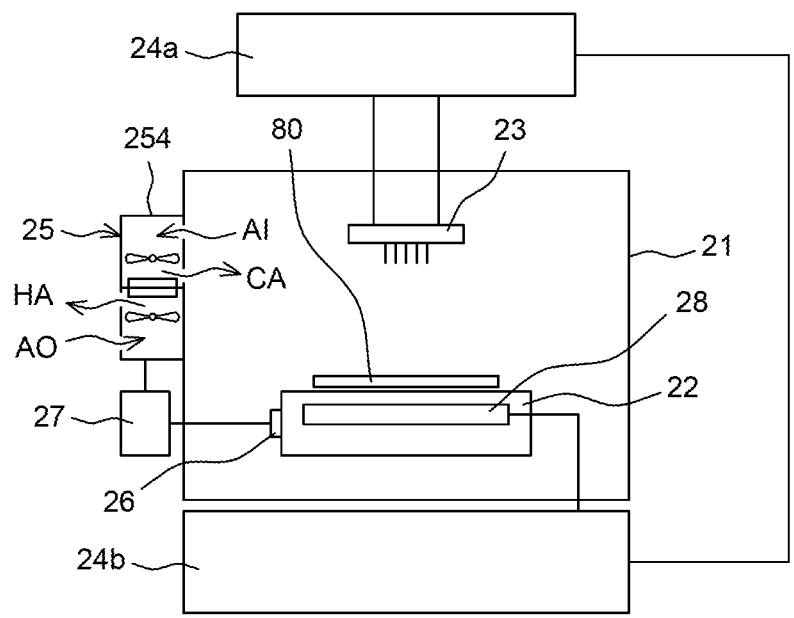
FIG. 6 is a diagram schematically showing a semiconductor test apparatus according to a fourth embodiment of the present invention.
Figure 7:
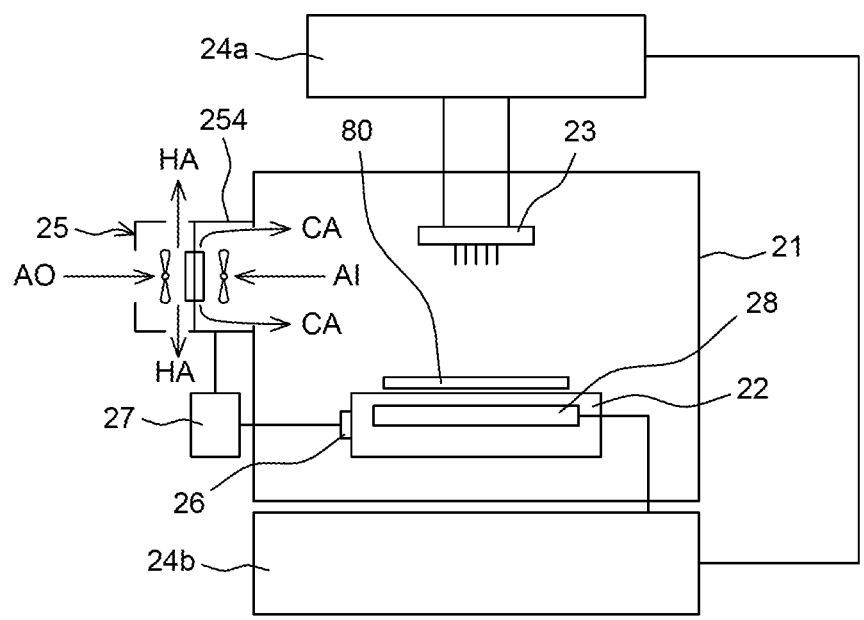
FIG. 7 is a diagram schematically showing a semiconductor test apparatus according to a fifth embodiment of the present invention.

Refer to FIG. 6. In one embodiment, the semiconductor refrigeration element is disposed inside a housing 254. The housing 254 is divided into a cold partition and a hot partition. The cold partition is interconnected with the inner side of the test chamber 21. The hot partition is interconnected with the outer side or the heat exhaust channel of the test chamber 21. The cold end of the semiconductor refrigeration element is faced to the cold partition of the housing 254. The hot end of the semiconductor refrigeration element is faced to the hot partition. According to the structure described above, the cold partition of the housing 254 may be regarded as an extension of the test chamber 21; the hot partition of the housing 254 may be regarded as the outer side of the test chamber 21. As describe above, the electric fan absorbs the air AI inside the test chamber 21 into the cold partition of the hosing 254 to chill the air and drives the cooled air CA into the test chamber 21. The electric fan also absorbs the air AO outside the test chamber 21 into the hot partition and exhausts the heated air HA to assist the hot end of the semiconductor refrigeration element in heat dissipation. No matter whether the cold end and hot end of the semiconductor refrigeration element are disposed in a top-bottom configuration (as shown in FIG. 6) or a left-right configuration (as shown in FIG. 7), they can always implement the present invention.

In one embodiment, the refrigeration element is a vortex tube. The vortex tube includes an air inlet, a hot air outlet, and a cold air outlet. After the air enters the vortex tube from the air inlet, hotter air is output from the hot air outlet, and colder air is output from the cold air outlet. Therefore, the chamber ambient temperature of the test chamber can be lowered via interconnecting the cold air outlet with the test chamber. Although a vortex tube can output air with a temperature lower than 0° C., it would consume a great amount of air. If a factor uses a lot of semiconductor test apparatuses and vortex tubes are used as refrigeration elements, the air supply system of the factory needs to be designed anew. If the chamber ambient temperature of the test chamber 21 only needs slightly reducing, a semiconductor refrigeration element would be a better choice for the refrigeration element of the semiconductor test apparatus of the present invention.

In conclusion, the semiconductor test apparatus of the present invention lowers the chamber ambient temperature of the test chamber via connecting a refrigeration element with the test chamber. The present invention can significantly simplify the cooling system of the semiconductor test apparatus and greatly reduce the cost of the semiconductor test apparatus. Further, the refrigeration element of the present invention is exempted from using consumable materials and easy to maintain. Therefore, the total cost is further reduced.

What is claimed is:

1. A semiconductor test apparatus comprising
   a test chamber;
   a chuck arranged inside the test chamber to fix a tested semiconductor element; and
   a refrigeration element connected with the test chamber, wherein the refrigeration element comprises:
   a first heat conduction element connected with a cold end of a semiconductor refrigeration element to increase a heat exchange area of the cold end of the semiconductor refrigeration element; and
   a first electric fan guiding air inside the test chamber to flow through the first heat conduction element to lower a chamber ambient temperature of the test chamber from a first temperature to a second temperature.

2. The semiconductor test apparatus according to claim 1, wherein a difference between the first temperature and the second temperature is smaller than or equal to 10° C.

3. The semiconductor test apparatus according to claim 1, wherein the first temperature is higher than an external environment temperature of an exterior of the test chamber; a difference between the first temperature and the external environment temperature is smaller than or equal to 10° C.

4. The semiconductor test apparatus according to claim 1 further comprising:
   a temperature sensor measuring an operating temperature of the chuck; and
   a controller electrically connected with the refrigeration element and the temperature sensor, and determining whether the refrigeration element is turned on according the operating temperature measured by the temperature sensor.

5. The semiconductor test apparatus according to claim 1 further comprising:
   a heating element connected with the chuck to heat the chuck.

6. The semiconductor test apparatus according to claim 1, wherein a refrigerating temperature of a refrigerating end of the refrigeration element is lower than an external environment temperature of an exterior of the test chamber; a difference between the refrigerating temperature and the external environment temperature is smaller than or equal to 6° C.

7. The semiconductor test apparatus according to claim 1, wherein the cold end of the semiconductor refrigeration element is disposed in an interior of the test chamber; a hot end of the semiconductor refrigeration element is disposed in an exterior of the test chamber.

8. The semiconductor test apparatus according to claim 7, wherein the refrigeration element further includes a second heat conduction element connected with the hot end of the semiconductor refrigeration element to increase a heat exchange area of the hot end of the semiconductor refrigeration element.

9. The semiconductor test apparatus according to claim 8, wherein the refrigeration element further includes a second electric fan guiding air outside the test chamber to flow through the second heat conduction element.

* * * * *